(12) United States Patent
Sullivan

(10) Patent No.: US 6,483,078 B2
(45) Date of Patent: Nov. 19, 2002

(54) MOISTURE CONTROL SYSTEM FOR ELECTRICAL DEVICES

(75) Inventor: Patrick K. Sullivan, Honolulu, HI (US)

(73) Assignee: Oceanit Laboratories, Inc., Honolulu, HI (US)

( * ) Notice: Subject to any disclaimer, the term of this patent is extended or adjusted under 35 U.S.C. 154(b) by 0 days.

(21) Appl. No.: 09/779,665

(22) Filed: Feb. 9, 2001

(65) Prior Publication Data

US 2001/0045421 A1 Nov. 29, 2001

Related U.S. Application Data

(60) Provisional application No. 60/181,196, filed on Feb. 9, 2000.

(51) Int. Cl.$^7$ .............................. H05B 1/00; H05B 3/00; H05B 11/00
(52) U.S. Cl. ........................................ 219/209; 165/228
(58) Field of Search ................................ 219/209, 213, 219/497, 780, 540, 529, 401; 62/150, 317; 338/35; 362/213; 165/228

(56) References Cited

U.S. PATENT DOCUMENTS

| | | | |
|---|---|---|---|
| 3,594,547 A | * | 7/1971 | Quinn ........................ 219/529 |
| 3,864,659 A | * | 2/1975 | Furuuchi et al. ............... 338/35 |
| 3,877,245 A | * | 4/1975 | Edwards ...................... 62/317 |
| 3,939,666 A | * | 2/1976 | Bashark ........................ 62/150 |
| 4,290,480 A | * | 9/1981 | Sukowski .................... 165/228 |
| 4,352,008 A | * | 9/1982 | Hofer et al. ................. 219/540 |
| 4,553,020 A | | 11/1985 | Val |
| 4,598,342 A | * | 7/1986 | English et al. ............... 362/213 |
| 4,620,248 A | | 10/1986 | Gitzendanner |
| 4,801,778 A | * | 1/1989 | Mizutani et al. ............ 219/780 |
| 5,123,478 A | | 6/1992 | Hosaka |
| 5,204,509 A | | 4/1993 | Etters et al. |
| 5,216,226 A | * | 6/1993 | Miyoshi ...................... 219/497 |
| 5,504,924 A | | 4/1996 | Ohashi et al. |
| 5,570,270 A | | 10/1996 | Naedel et al. |
| 5,574,627 A | | 11/1996 | Porter |
| 5,578,753 A | | 11/1996 | Weiss et al. |
| 5,729,003 A | | 3/1998 | Briggs, III |
| 5,731,545 A | | 3/1998 | Reed |
| 5,755,026 A | | 5/1998 | Stephan et al. |
| 6,054,676 A | * | 4/2000 | Wall et al. ................... 219/209 |
| 6,121,583 A | * | 9/2000 | Hansen ........................ 219/401 |
| 6,144,013 A | * | 11/2000 | Chu et al. .................... 219/209 |

\* cited by examiner

*Primary Examiner*—Teresa Walberg
*Assistant Examiner*—L Fastovsky
(74) *Attorney, Agent, or Firm*—James Creighton Wray; Meera P. Narasimhan

(57) ABSTRACT

A moisture control device and method has a heat generating source in electrical devices that is powered to operate independent of the electrical device for reducing, minimizing or preventing condensation, nucleation and degradations on electronic parts and circuit boards of the electrical device. A power supply is connected to the heat generating source and a switch connected to the power supply. The switch may be manually operable or automatic and is used for controlling operation of the heat generating source. A sensor senses on/off status of the electrical device and automatically operates the switch in response to the sensing. Power is supplied to the heat generating source when the electrical device powers down and disconnected when the electrical device powers on.

36 Claims, 1 Drawing Sheet

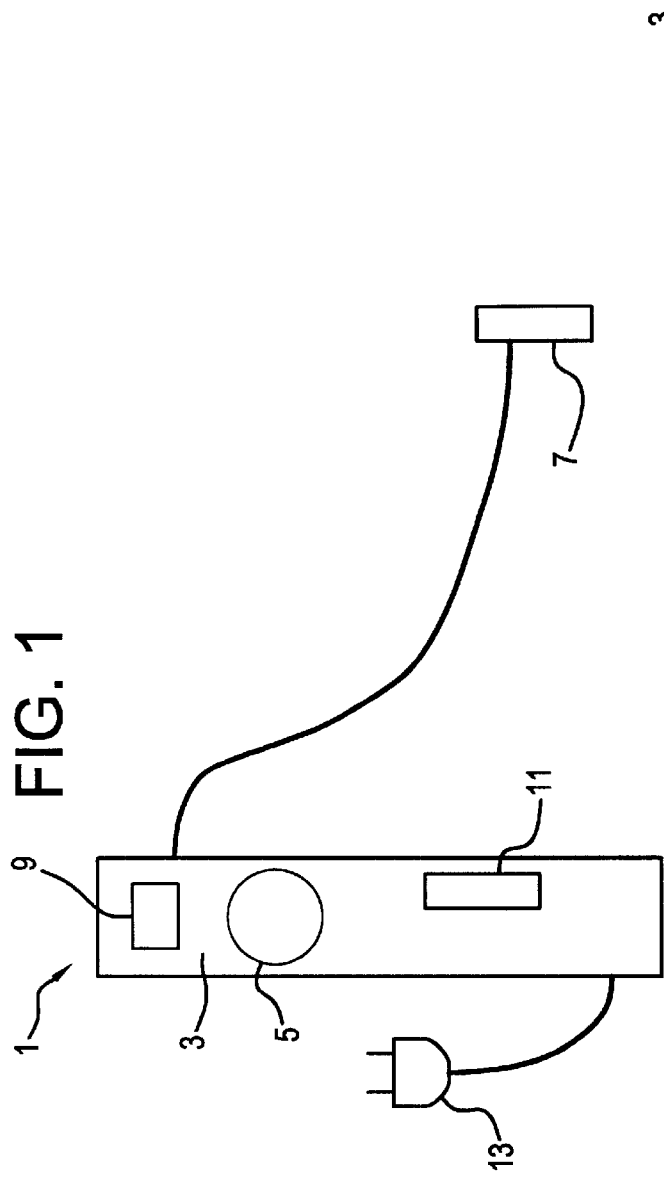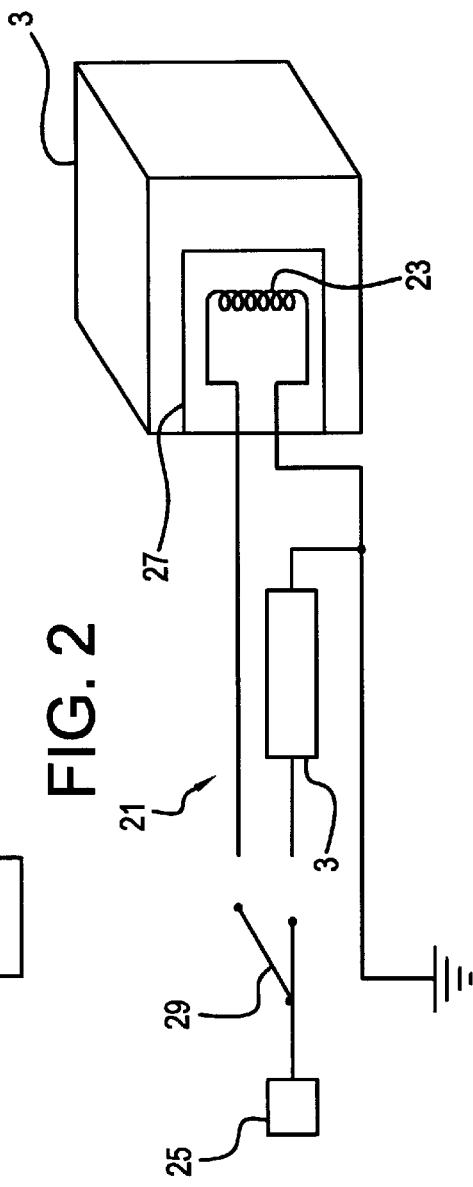

MOISTURE CONTROL SYSTEM FOR ELECTRICAL DEVICES

This application claims the benefit of U.S. Provisional application Ser. No. 60/181,196 filed Feb. 9, 2000.

BACKGROUND OF THE INVENTION

Condensation on electronic parts and circuit boards of an electrical device may lead to failure of those parts and of the device due to corrosion or short circuits of the electrical system. In areas of high humidity, such as in an ocean-front environment, the likelihood of condensation on electronic parts and circuit boards of an electrical device is heightened due to the increased humidity. The likelihood of condensation on electronic parts and circuit boards of an electrical device is further increased when the power supply to the electrical device is turned off.

Under normal working conditions, the heat generated during operation of the electrical device precludes the formation of condensation on electronic parts and circuit boards. However, when the electrical device is not being used, there is no heat being generated to prevent the formation of condensation on electronic parts and circuit boards. Therefore, users leave their electrical devices powered to prevent condensation from forming within the electrical device.

A need exists for reducing, minimizing, or preventing condensation on electronic parts and circuit boards of electrical devices, as well as reducing, minimizing, or preventing nucleation and any other related degradations of those parts, particularly while the electrical device is not in use.

SUMMARY OF THE INVENTION

The present invention is a moisture control system for reducing, minimizing or preventing condensation, nucleation and other related degradations on electronic parts and circuit boards of electrical devices. The electrical devices that benefit from such a system include, but are not limited to, computers, computer cases, computer peripherals, VCRs and TVs.

The present invention is a device that has a heat generating source that is inserted into an electrical device to be protected from the formation of condensation. Power supplied to the heat generating source causes it to generate heat. The heat generating source includes, but is not limited to, a lamp, nichrome wire, or similar other heat source.

Power may be supplied manually to the heat generating source by turning on a switch when powering down the electrical device to be protected. When the electrical device is turned back on, power is then cut to the heat generating source by manually turning the switch off.

Alternatively, power may be automatically supplied to the heat generating source when the electrical device powers down. A sensor senses when power to the electrical device is turned off so that power to the heat generating source is then automatically turned on. The sensor also senses when power is turned back on to the electrical device so that power to the heat generating device is then automatically turned off.

These and further and other objects and features of the invention are apparent in the disclosure, which includes the above and ongoing written specification, with the claims and the drawings.

BRIEF DESCRIPTION OF THE DRAWINGS

FIG. 1 is a diagram of the moisture control system installed in a computer using a heating lamp.

FIG. 2 is a diagram of the moisture control system installed in a computer using a nichrome wire heating element.

DETAILED DESCRIPTION OF THE PREFERRED EMBODIMENTS

FIG. 1 is a diagram of a moisture control system 1 installed in a computer 3 using a heating lamp 5 as the heat generating source. In the embodiment shown in FIG. 1, the heating lamp is a 4 watt bulb. Power to the heating lamp 5 is supplied remotely by a 5 V power supply 7 that is independent from the power supplied to the computer through the power cord 13. A relay 9 transmits power from the power supply 7 to the heating lamp 5. Fuse 11 protects the moisture control system 1 and computer 3 from a power overload. The moisture control system 1 fits in a spare PC case card slot.

The preferred moisture control system is useful for reducing, minimizing or preventing condensation, nucleation and other related degradations on electronic parts and circuit boards of electrical devices. The electrical devices that benefit from such a system include, but are not limited to, computers, computer cases, computer peripherals, VCRs and TVs.

FIG. 2 is a schematic of a moisture control system 21 installed in a computer 3 using a nichrome wire heating element 23 as the heat generating source. The embodiment of the moisture control system shown in FIG. 2 runs off the same power supply 25 that powers the computer 3.

The invention has a heat generating source that is preferably inserted into an electrical device to be protected from the formation of condensation. Power supplied to the heat generating source causes it to generate heat. The heat generating source includes, but is not limited to, a lamp, nichrome wire, or similar other heat source.

A PC board 27 contains the heat generating source, for example a nichrome wire 23. The PC board 27 plugs directly into a slot in a standard personal computer 3. Since the board 27 is plugged into a slot in the PC 3, it is tied into the PC's electrical system.

A sensor located on the board detects when power is being supplied from the power supply 25 to the PC 3. When the sensor detects power to the PC 3, switch 29 is closed. With the switch 29 closed, no power is sent to the nichrome wire heating element 23 on the PC board 27. When the sensor detects that no power is being supplied to the PC 3 from the power supply 25, switch 29 opens, as shown in FIG. 2.

When the switch 29 is open, power is sent to the nichrome wire heating element 23. The heat emitted by heating the nichrome wire heating element 23 protects the internal electronic parts and circuit boards of electrical devices from the onset of condensation.

Power may be supplied manually to the heat generating source by turning on a switch when powering down the electrical device to be protected. When the electrical device is turned back on, power is then cut to the heat generating source by manually turning the switch off. Alternatively, power may be automatically supplied to the heat generating source when the electrical device powers down. The sensor senses when power to the electrical device is turned off so that power to the heat generating source is then automatically turned on. The sensor also senses when power is turned back on to the electrical device so that power to the heat generating device is then automatically turned off.

While the invention has been described with reference to specific embodiments, modifications and variations of the invention may be constructed without departing from the scope of the invention, which is defined in the following claims.

I claim:

1. A moisture control apparatus comprising an electrical device, a heat generating source connected to the electrical device, a power supply connected to the heat generating source for operating the heat generating source independent of an operation of the electrical device for reducing, minimizing or preventing condensation, nucleation and related degradations on electronic parts and circuit boards of the electrical device.

2. The apparatus of claim 1, wherein the heat generating source is a lamp.

3. The apparatus of claim 1, wherein the heat generating source is nichrome wire.

4. The apparatus of claim 1, wherein the electrical device is selected from a group consisting of computers, computer cases, computer peripherals, VCRs, switchboards and TVs.

5. The apparatus of claim 1, further comprising a switch connected to the power supply.

6. The apparatus of claim 5, wherein the switch is a manually operable switch connected to the power supply for controlling an operation of the heat generating source.

7. The apparatus of claim 6, wherein the operation includes turning the switch on and off when respectively powering off and on the electrical device to be protected.

8. The apparatus of claim 5, wherein the switch is an automatic switch for automatically supplying power to the heat generating source when the electrical device powers down and for cutting of power to the heat generating source when the electrical device powers on.

9. The apparatus of claim 8, further comprising a sensor for sensing a status of the electrical device for determining if the electrical device is on or off.

10. The apparatus of claim 9, wherein the sensor generates signals indicating the on or off status of the electrical device.

11. The apparatus of claim 10, wherein the signals trigger the automatic switch for automatically activating the heat generating source when the electrical device is off and for automatically de-activating the heat generating source when the electrical device is on.

12. A moisture control system for electrical devices comprising a heat generating source, power supply connected to the heat generating source, wherein the power supply activates the heat generating source independent of an operation of the electrical devices.

13. The system of claim 12, further comprising a relay connecting the power supply to the heat generating source and a fuse for protecting the system from a power overload.

14. The system of claim 13, wherein the power supply is a battery source.

15. The system of claim 12, wherein the heat generating source is a heating lamp having a 4 watt bulb.

16. The system of claim 12, wherein the heat generating source is nichrome wire.

17. The system of claim 12, wherein the power supply powers the computer.

18. The system of claim 12, wherein system is provided in a card slot for a PC.

19. The system of claim 18, wherein the system is a PC board connected to an electrical circuit of the PC.

20. The system of claim 19, further comprising a sensor located on the board for detecting power being supplied from the power supply to the PC.

21. The system of claim 20, wherein the sensor generates signals responsive to the detecting of power.

22. The system of claim 21, further comprising a switch connected to the system.

23. The system of claim 22, wherein the signals activate the switch to open and closed positions corresponding respectively to off/on status of the electrical devices.

24. The system of claim 23, wherein the heat generating source is de-activated when the switch is closed.

25. The system of claim 23, wherein the heat generating source is activated when the switch is open.

26. The system of claim 25, wherein the heat generating source when activated emits heat for decreasing, preventing and removing condensation from internal electronic parts and circuit boards of electrical devices.

27. A moisture control method comprising providing a heat generating source in an electrical device, connecting a power supply to the heat generating source, operating the power supply independent of an operation of the electrical device thereby reducing, minimizing or preventing condensation, nucleation and degradations on electronic parts and circuit boards of the electrical device.

28. The method of claim 27, further comprising connecting a switch to the power supply.

29. The method of claim 27, further comprising manually operating the switch and controlling operation of the heat generating source.

30. The method of claim 29, wherein the operating comprises turning the switch on and off when respectively powering off and on the electrical device to be protected.

31. The method of claim 28, further comprising sensing an on/off status of the electrical device.

32. The method of claim 31, further comprising automatically operating the switch in response to the sensing.

33. The method of claim 32, further comprising supplying power to the heat generating source when the electrical device powers down.

34. The method of claim 32, further comprising disconnecting power to the heat generating source when the electrical device powers on.

35. The method of claim 31, wherein the sensing is done by sensors for generating signals indicating the on/off status of the electrical device.

36. The method of claim 31, wherein the signals trigger the automatic switch for automatically activating the heat generating source when the electrical device is off and for automatically de-activating the heat generating source when the electrical device is on.

* * * * *